United States Patent [19]
Dostis

[11] 3,737,784
[45] June 5, 1973

[54] CIRCUITS WITH BROAD BAND FLAT FREQUENCY RESPONSES USING DIRECTIONAL FILTERS

[75] Inventor: Irving Dostis, Palos Verdes Peninsula, Calif.

[73] Assignee: Communications Satellite Corporation, Washington, D.C.

[22] Filed: July 21, 1971

[21] Appl. No.: 164,545

[52] U.S. Cl. ..................325/436, 325/430, 325/438, 325/439, 325/485, 330/34, 330/53, 333/24.2
[51] Int. Cl. ..............................................H04b 1/26
[58] Field of Search......................325/430, 436, 437, 325/439, 446, 449, 485; 321/69 W; 330/21, 31, 34, 53, 4.5; 307/88.3; 333/84 M

[56] References Cited

UNITED STATES PATENTS 3,208,003 9/1965 Sterzer ..............................330/34 X
3,293,447 12/1966 Fleming.............................330/34 X

*Primary Examiner*—Albert J. Mayer
*Attorney*—Sughrue, Rothwell, Mion, Zinn & Macpeak

[57] ABSTRACT

Disclosed heren is a technique for producing broad band flat frequency responses using active elements by eliminating mismatch caused energy reflections. The technique provides for the upling of directional filters to selected ports of n active element. Each of the directional filters includes a resistive termination matched to the source impedance of the port to which it is coupled over a broad band of frequencies outside of the filter passband.

1 Claim, 3 Drawing Figures

INVENTOR
IRVING DOSTIS

BY Sughrue, Rothwell, Mion, Zinn & Macpeak
ATTORNEYS

Patented June 5, 1973

3,737,784

2 Sheets-Sheet 2

CIRCUITS WITH BROAD BAND FLAT FREQUENCY RESPONSES USING DIRECTIONAL FILTERS

BACKGROUND OF THE INVENTION

The invention is in the field of broad band active circuits and finds specific application to circuits which include mixers, amplifiers and multipliers.

In practice, circuits which include active elements are caused to act on signals within a desired frequency band. The desired frequency band is usually controlled by passing the signals through suitable filtering means. It is generally known to provide matching between the active element and the circuitry to which it is connected to thereby eliminate signal reflection.

When the element is coupled to further circuitry through suitable filters, energy from the active element within the filter passband is substantially absorbed by the circuitry assuming proper matching. However, the filters look reactive to signals outside of their passbands, causing these signals to be reflected back into the active element. To avoid such signal reflection, it has been the practice to provide additional and generally complex circuitry to match the active element to the filtering means at frequencies outside of the filter passband.

To better understanding the problem and the manner in which signals at frequencies outside of the desired frequency band occur in the active element, the following description of the problem is given with respect to a mixer arrangement.

In conventional mixer arrangements, a first port is coupled through a filter to a receiving means, a second port is coupled through a filter to a local oscillator and a third port is coupled through a filter to an output network. At the mixer, the received signal is combined with the local oscillator signal to provide an output signal at a center frequency determined by the mixer conversion characteristic and the frequencies of the locally generated and received signals. Since the mixing process is non-linear, there is generated within the mixer, signals at frequencies which are harmonics and products of the input signals. In conventional mixer arrangements these harmonic and product signals cause variations in the output signal frequency response.

These variations are produced as follows: Considering a mixer port with a filter coupled to its input, input signals within the filter passband enter the mixer port through the filter and are mixed with other signals introduced into the mixer. In addition to producing signals at the desired center frequency, the mixing process produces harmonic and product frequency signals which may be outside the filter passband. The filter looks reactive to these signals causing them to be reflected back into the mixer. The reflected signals under go mixing, thereby producing signals at frequencies other than the desired center frequency but lying within the passband of the filter. These signals pass out of the mixer causing variations or ripples in the frequency response of the output signal.

Analogous problems exist with other active element circuits. In each case broad band matching must be provided in order to avoid deterioration of circuit effectiveness.

SUMMARY OF THE INVENTION

It is the object of the invention to provide a simple and relatively inexpensive technique for providing a flat frequency response over a broad frequency band. The object is accomplished by coupling directional filters to the active elements, the directional filters providing a resistive termination matched to the source impedance of the active element to which it is coupled over a broad band of frequencies outside the filter passband.

Two specific embodiments are illustrated. In one the directional filters are applied to the ports of a mixer element to eliminate reflection of mixer generated signals having frequencies outside of desired bands. In the second embodiment the teachings of the invention are applied to a tunnel diode amplifier circuit.

DESCRIPTION OF THE PREFERRED EMBODIMENT

Figure 1:
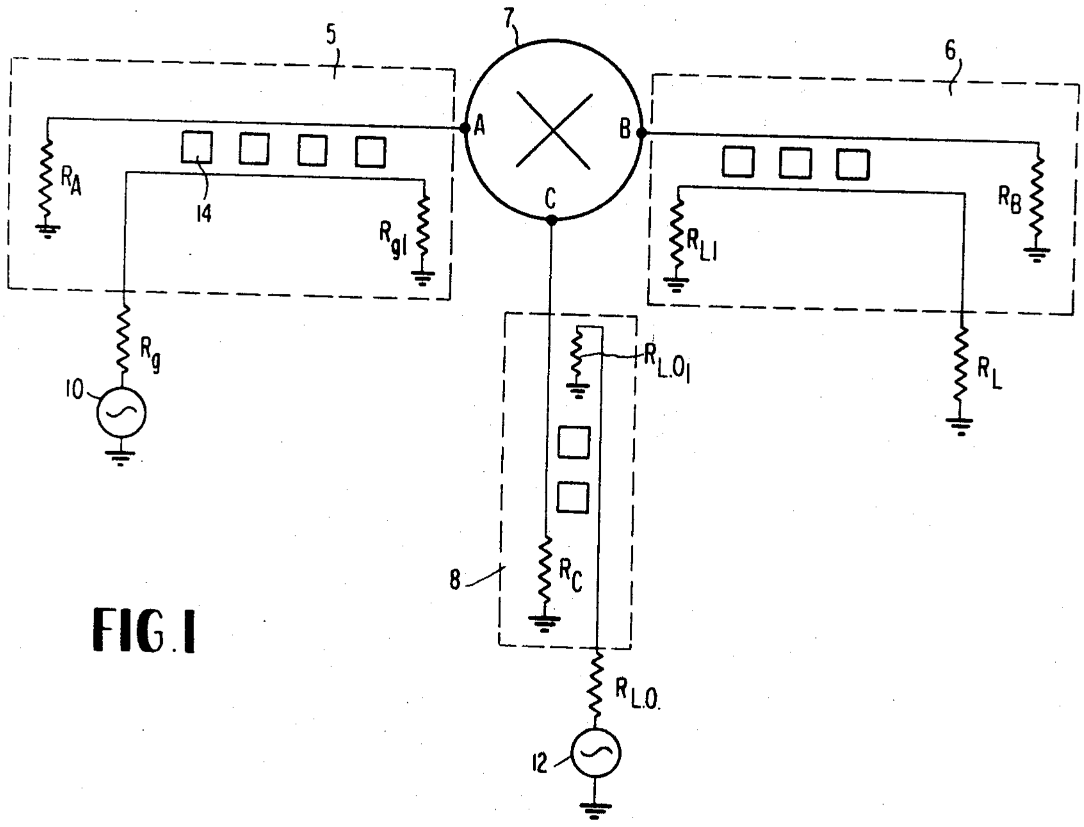
FIG. 1 illustrates a mixer arrangement incorporating the principles of this invention.

FIG. 1 illustrates a mixer arrangement incorporating the teachings of the present invention. Each port of the mixer 7 is coupled to a directional filter 5, 6, 8. The mixing element itself can be of varying configurations depending upon the particular application. For example, the mixing element may be a single ended diode, a balanced diode, a transistor, or any of other known configurations. Further, it should be understood that the teachings of the invention do not require the use of a directional filter at each port. It is envisioned that such filters may be used at only one or two ports rather than at all of the ports as illustrated. The decision as to which of the ports are coupled to directional filters must be based upon the consideration of the amount of reflection at each port and the associated deterioration of circuit effectiveness versus the reduction in circuit efficiency resulting from losses introduced by the directional filter.

Each of the directional filters is designed to provide proper filter characteristics for the particular port to which it is connected. Directional filters which may be adapted for use in accordance with the teachings of this invention are known in the art. Examples of such filters are described in the publication by Matthaei, Young and Jones entitled *Microwave Filters, Impedance-Mathcing Network and Coupling Structures*, McGraw-Hill Book Co., 1964.

Figure 2:
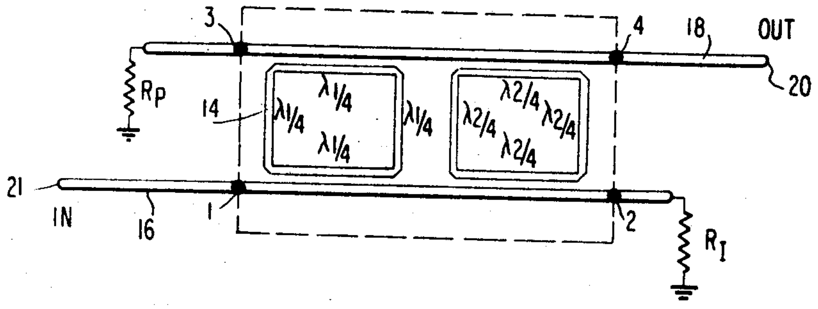
FIG. 2 illustrates a directional filter which may be used with the mixer arrangement of this invention.

FIG. 2 illustrates a directional filter which may be used with the instant invention. It consists of a pair of coupled transmission lines 16, 18. Each of the transmission lines is terminated in a resistive impedance $R_l$, $R_p$. The filter is directional, that is, within its passband little loss is encountered in the transmission of signals from port 1 to port 4, or from port 4 to port 1. However, substantial attenuation is encountered in the transmission of signals from port 2 to port 3 or from port 3 to port 2.

Frequency sensitivity is accomplished through the use of coupling rings 14. Each ring is made responsive to a different center frequency. By including a number of coupling rings, each responsive to a different center frequency, the bandpass of the directional filter is determined.

At frequencies where the coupling is not effective, that is, at frequencies outside of the bandpass of the filter, the device appears as two independent transmission lines terminated in resistive loads. If $R_P$ is made to match the source impedance of an element coupled at terminal 20 of transmission line 18 then the circuit element will be matched for all frequencies where this equivalent circuit is applicable. Similarly, if $R_I$ matches the source impedance of the circuit element coupled to the transmission line 16 at terminal 21, that circuit element will be matched for all frequencies where the equivalent circuit is applicable. It is noted that if the source impedance is frequency dependent then matching can be made effective over a very wide band of frequencies though not over all frequencies outside of the filter passband. When the coupling is active, the circuit element coupled to terminal 20 is matched to the circuit element coupled to element 21 in a conventional manner.

Returning to FIG. 1, it is seen that mixing element 7 has three ports A, B, C. It is to be understood however that the principles of this invention are not limited to a three port mixing element. Port A may be viewed as the input port receiving an input signal from generator 10 through directional filter 5. Port C is coupled through a directional filter 8 to a local oscillator 12. Mixer 7 mixes the signals received at ports A and C to generate an output signal at port B. The signal at port B is related to the signals at ports A and C by the conversion characteristic of the mixer. For example the signal at port B may have a center frequency equal to the difference between the center frequencies of the signals produced by sources 10 and 12.

Each of the directional filters 5, 6, 8 has a number of coupling rings 14 to determine the passband of the directional filter. When filter 5 is active, that is, when it is receiving signals within its passband, the signals from generator 10 pass through the directional filter to port A. Similarly, when directional filter 8 is active signals from the local oscillator 12 pass through the directional filter to port C. These signals are mixed in mixer 7 to generate an output signal at a desired center frequency as well as signals at harmonic and product frequencies of the signals received at ports A and C. Because of the directional filters, ports A and C are terminated in a resistive impedance over a wide band of frequencies greater than the passband of the directional filters.

Thus, for signals at frequencies outside of the passband of directional filter 5 the directional filter appears as a resistive termination of value $R_A$. Similarly, the signal at port C sees a resistive termination of value $R_C$. By making $R_A$ equal to the source impedance of port A the energy passing down the transmission line between port A and termination $R_A$ is dissipated in $R_A$ thus providing a match for signals outside the passband of the directional filter. Similarly, by properly choosing $R_C$ the energy passing from port C over the transmission line to $R_C$ is dissipated in $R_C$.

Directional filter 6 couples port B to the load $R_L$. Output signals within the passband of filter pass through the filter to load impedance $R_L$. However, in the manner previously described, signals appearing at port B outside of the passband of the filter 6 travel down the transmission line from port B to terminating resistance $R_B$ where they are dissipated.

Terminations $R_{g1}$, $R_{L1}$, and $R_{LO1}$, are selected to match the source impedance of the circuit element respectively coupled thereto.

Figure 3:
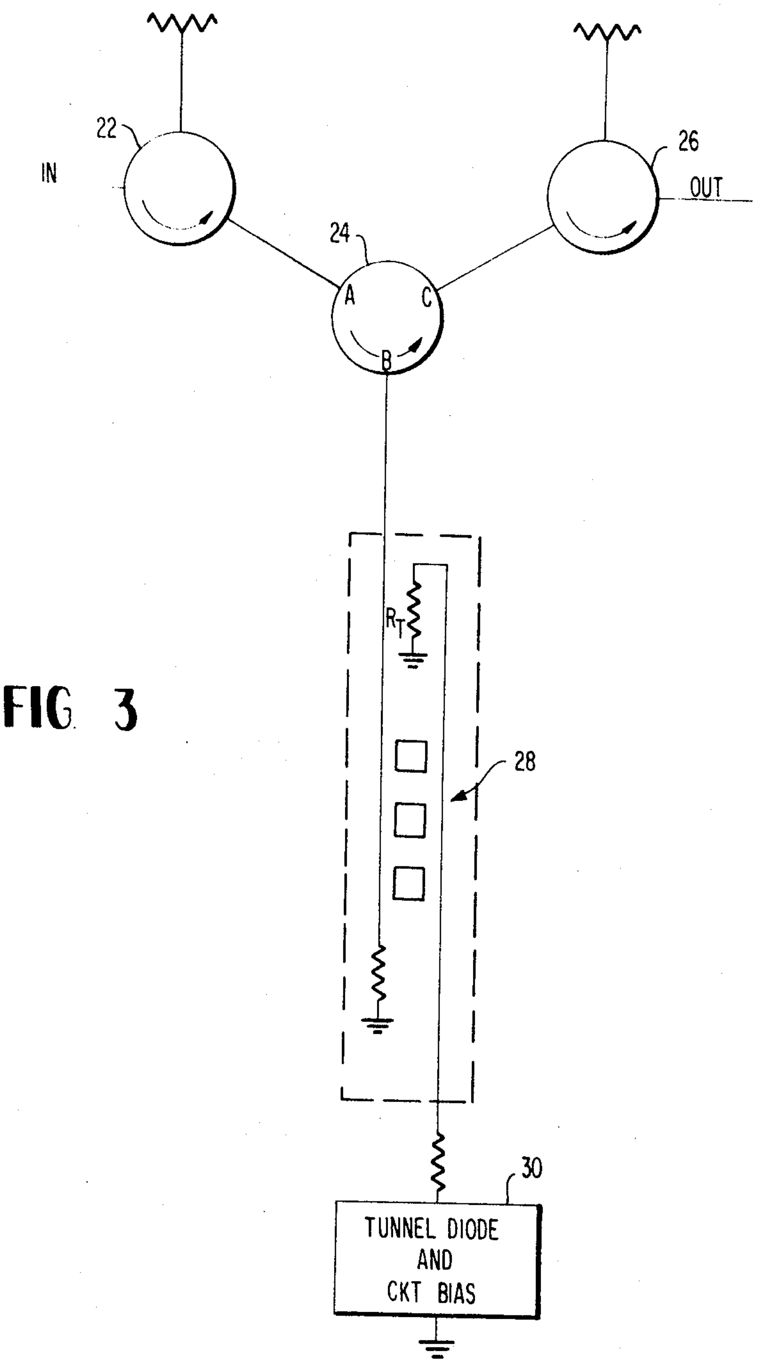
FIG. 3 illustrates a tunnel diode amplifier circuit incorporating the teachings of the invention.

FIG. 3 illustrates a conventional circuit arrangement incorporating a tunnel diode amplifier except for the directional filter 28. Operation of such a circuit is well known and a description thereof not necessary for a full understanding of the invention. In brief, the circuit consists of circulators 22, 24 and 26. In conventional circuits the tunnel diode amplifier 30 is generally coupled through suitable filtering means to port B of circulator 24. Circulators 22 and 26 are used for isolation purposes. Incoming signals pass through circulator 22 to input port A of circulator 24. The signal travels in the direction of circulation to port B and down the transmission line to the tunnel diode amplifier.

Convention tunnel diode amplifier circuits present a stability problem. Specifically, the tunnel diode is intrinsically a broad band element capable of amplifying signals over a broad frequency range. In practice the signal which is to undergo amplification is within a relatively narrow frequency band. However, due to noise, some of which is generated by the tunnel diode amplifier itself, the diode sees signals at frequencies outside of the narrow frequency band of the signal to be amplified. Without proper matching, the tunnel diode amplifier may operate as an oscillator. To provide stable operation, that is to prevent the tunnel diode amplifier from functioning as an oscillator, a directional filter 28 is coupled between the circuit 30 and port B of circulator 24. Resistance $R_T$ is selected to stabilize the tunnel diode amplifier. Signals within the filter passband appear at port B. Since port B is matched to the tunnel diode amplifier over the passband frequencies no reflection results.

Although the invention has been described with respect to a mixer arrangement and a tunnel diode amplifier circuit, it is understood by those skilled in the art that the basic concept disclosed herein is equally applicable to other active elements where wide band matches are required.

Although the invention has been described with respect to a preferred embodiment thereof it is understood by those skilled in the art that various modifications can be made in construction and arrangement within the scope of the invention as defined in the appended claims.

What is claimed is:

1. In combination, a three port mixer element, first and second signal generating means, a first directional filter coupled to a first port of said mixer element and said first signal generating means, said first directional filter including a resistive termination matched to the source impedance of said first port at frequencies outside of said first filter passband and a resistive termination matched to the source impedance of said first signal generating means at frequencies outside of said first filter passband, a second directional filter coupled to a second port of said mixer element and said second signal generating means, said second directional filter including a resistive termination matched to the source impedance of said second port at frequencies outside the passband of said second directional filter and a resistive termination matched to the source impedance of said second signal generating means at frequencies outside the passband of said second directional filter, a load impedance and a third directional filter coupled to a third port of said mixer element and said load impedance, said third directional filter including a resistive termination matched to the source impedance of said third port at frequencies outside of the passband of said third directional filter and resistive termination matched to the load impedance.

* * * * *